(12) United States Patent
Denhez

(10) Patent No.: US 8,773,292 B2
(45) Date of Patent: Jul. 8, 2014

(54) DATA COMPRESSION

(71) Applicant: Alain Denhez, Paris (FR)

(72) Inventor: Alain Denhez, Paris (FR)

(73) Assignee: Alcatel Lucent, Paris (FR)

( * ) Notice: Subject to any disclaimer, the term of this patent is extended or adjusted under 35 U.S.C. 154(b) by 0 days.

(21) Appl. No.: 13/647,607

(22) Filed: Oct. 9, 2012

(65) Prior Publication Data

US 2014/0097974 A1 Apr. 10, 2014

(51) Int. Cl.
*H03M 7/30* (2006.01)
(52) U.S. Cl.
USPC ............................................. 341/87; 341/50

(58) Field of Classification Search
USPC ............................... 341/60, 50, 51, 106, 87, 5
See application file for complete search history.

(56) References Cited

U.S. PATENT DOCUMENTS

2006/0001557 A1* 1/2006 Liao ................................ 341/60

\* cited by examiner

*Primary Examiner* — Peguy Jean Pierre
(74) *Attorney, Agent, or Firm* — Carlson, Gaskey & Olds

(57) ABSTRACT

An exemplary encoder device includes a data storage comprising an indication of a coordinate system and a set of symbols, each having at least one coordinate position in the coordinate system. A processor associated with the data storage is configured to encode at least one symbol within information comprising a plurality of symbols using the coordinate position of the at least one symbol relative to the coordinate position of another symbol within the information.

17 Claims, 2 Drawing Sheets

DATA COMPRESSION

TECHNICAL FIELD

This invention generally relates to data management. More particularly, this invention relates to data compression.

DESCRIPTION OF THE RELATED ART

Data management is necessary for a variety of situations. For example, communications often involve transferring relatively large amounts of data between different devices. The data transfer may be streamlined by compressing the data before transmitting it from one device to another. Data compression can increase the amount of information that can be communicated over a given bandwidth. A variety of data compression techniques are known.

Some known data compression techniques may not always result in a smaller file or a smaller amount of information. For example, in the case of small files, some data compression techniques do not introduce any size decrease. In such cases, a data compression technique adds additional processor requirements without providing any savings in terms of file size.

SUMMARY

An exemplary encoder device includes a data storage comprising an indication of a coordinate system and a set of symbols, each having at least one coordinate position in the coordinate system. A processor associated with the data storage is configured to encode at least one symbol within information comprising a plurality of symbols using the coordinate position of the at least one symbol relative to the coordinate position of another symbol within the information.

An exemplary decoder device includes a data storage comprising an indication of a coordinate system and a set of symbols, each having a coordinate position in the coordinate system. A processor associated with the data storage is configured to decode at least one symbol within coded information by determining a coordinate position of the at least one symbol relative to another coordinate position within the information.

A method of coding information comprising a plurality of symbols includes determining at least one coordinate position within a coordinate system of at least one of the symbols using the coordinate position of the at least one symbol relative to the coordinate position of another symbol within the information.

An exemplary method of decoding coded information includes determining at least one symbol within coded information by determining a coordinate position of the at least one symbol relative to another coordinate position within the information.

The various features and advantages of a disclosed example embodiment will become apparent to those skilled in the art from the following detailed description. The drawings that accompany the detailed description can be briefly described as follows.

DETAILED DESCRIPTION

Figure 1:
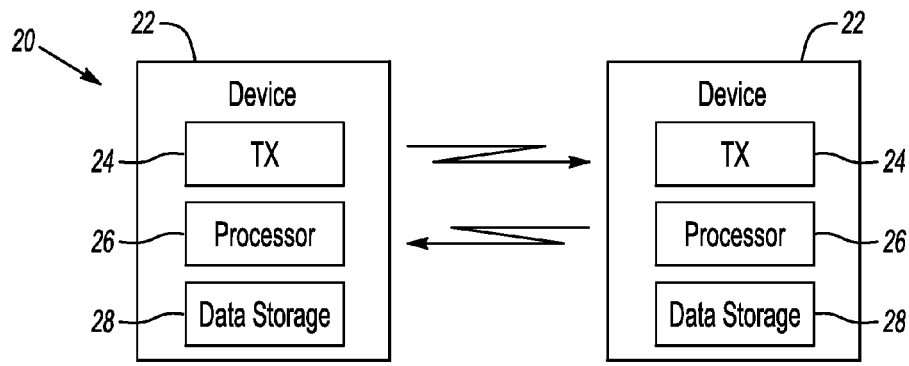
FIG. 1 schematically illustrates a system that utilizes information that is coded according to an embodiment of this invention.

FIG. 1 schematically illustrates a system 20 in which coded information is useful. The illustrated example includes communication devices 22 that are configured for communicating with each other using coded information for the communications. Each device 22 includes a transceiver 24 that is configured for transmitting information to another device 22 or receiving information from another device 22. Each of the devices 22 includes a processor 26 that is configured to code information to be communicated to another device. The example processors 26 are also configured to decode coded information received from another device.

In the illustrated example, each device 22 is capable of encoding and decoding a communication. In some examples a device 22 is only an encoder. In other examples a device 22 is only a decoder.

A data storage 28 of each device 22 includes instructions that are executable by the associated processor 26. The data storage 28 also includes an indication of a coordinate system, of a set of symbols, and a coordinate position of each of the symbols within the coordinate system. The coordinate positions of the symbols are used for coding and decoding information. The indication of the coordinate system may take a variety of forms. One example includes a look up table. The indication of the coordinate system in the database 28 can be selected so that the associated processor 26 is capable of interpreting the information for performing the encoding or decoding.

The system 20 shown in FIG. 1 includes communication among devices 22. Data compression is used for reducing the amount of data that must be transferred among the devices for completing a desired communication of information. The data compression techniques of this description are useful for other systems that do not include communication among different devices. For example, the data compression techniques described below may be used for storing information in a compressed or coded form to reduce the amount of storage capacity required to maintain a record of the information. The data compression techniques described below may be used for other information handling or data processing purposes. The communication arrangement shown in FIG. 1 is not to be considered as limiting the applicability of the example data compression techniques.

Figure 2:
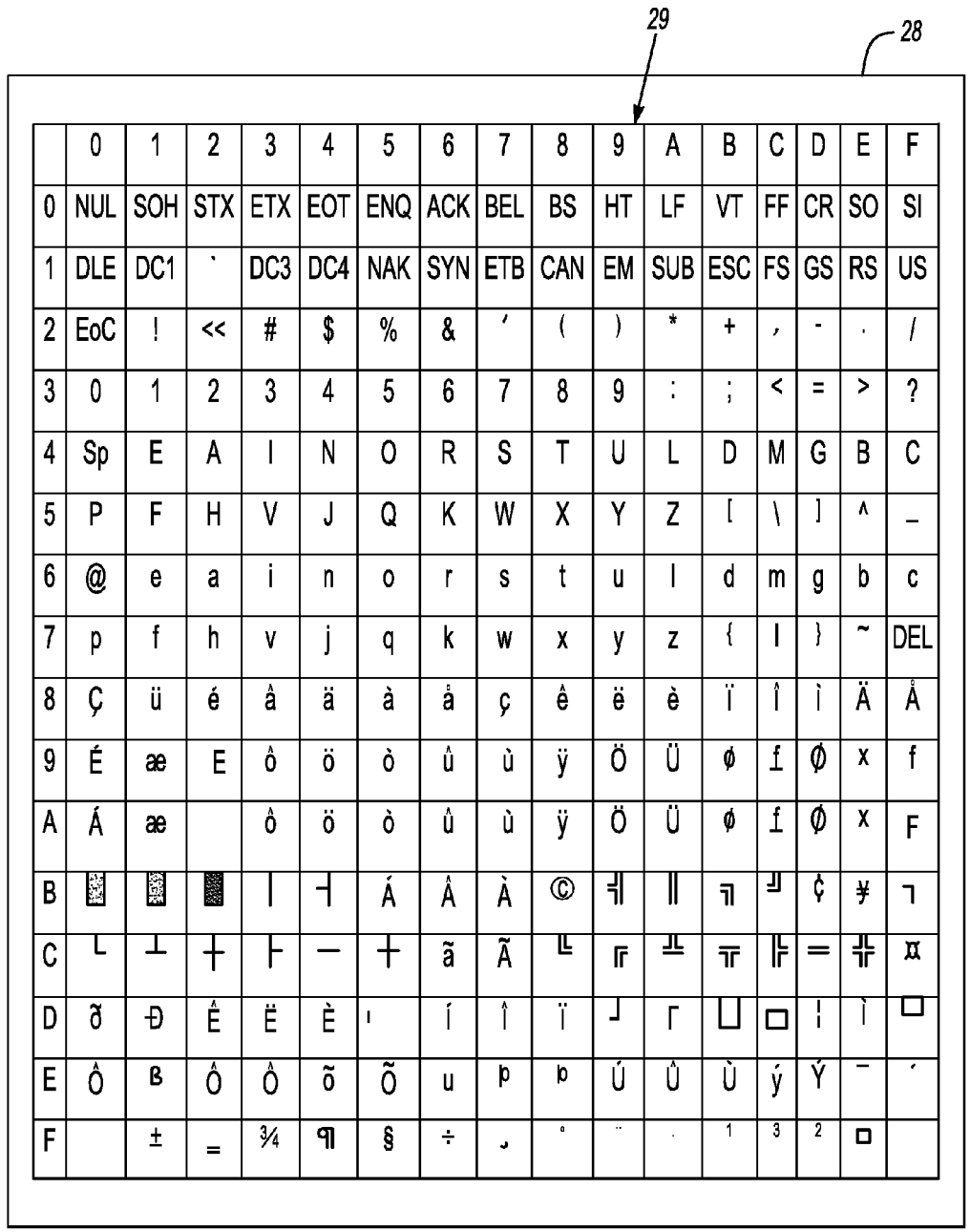
FIG. 2 schematically illustrates an example coordinate system and a plurality of symbols that may be included as part of information.

FIG. 2 illustrates a selected portion of the example data storage 28. A coordinate system 29 includes a coordinate position for each of a plurality of characters that may be included within information that should be coded for data compression purposes. In this example, the coordinate system comprises a grid having at least two dimensions. In this particular example, the coordinate system comprises a chart including a plurality of rows and columns. Each symbol is at a coordinate position identified by one of the rows and one of the columns. For example, the symbol or character A is in row 4 and column 2 and the character n is in row 6, column 4.

In the illustrated example, the rows of the coordinate system chart are identified as 0-F and the columns are identified as 0-F. In the illustrated example, the symbols within the chart correspond to the ASCII (American Standard Code for Information Interchange) symbols.

As can be appreciated from FIG. 2, the symbols corresponding to letters are not arranged in alphabetical order. Instead, the arrangement of the letter symbols has been strategically selected. In the illustrated example, each of the letter symbols has a likelihood that it would be included in a word (or information) within data that will be compressed. That likelihood is determined based upon known information regarding the frequency with which each letter is used within a particular language. The illustrated example includes an arrangement of the letter symbols corresponding to the frequency with which those letters are used in the French language.

In this example, a first subset of the letters, which typically are used more frequently than other letters in the French language, are arranged relative to each other within the coordinate system to minimize distance between their respective coordinate positions. In the illustrated example, the first subset includes the letters e, a, i, n, o, r, s, t, u and l. The letters in the first subset in this example are all placed within the same row. Movement between their respective coordinate positions does not require moving into another row. Eliminating movement in at least one direction reduces or minimizes the amount of movement among their respective coordinate positions.

Each of the letters is the first subset has a higher likelihood of being included in a word in the French language compared to other letters from the alphabet. Those other letters are part of a second subset with a second, lower likelihood of being used in a typical word or set of symbols in information to be coded.

Figure 3:
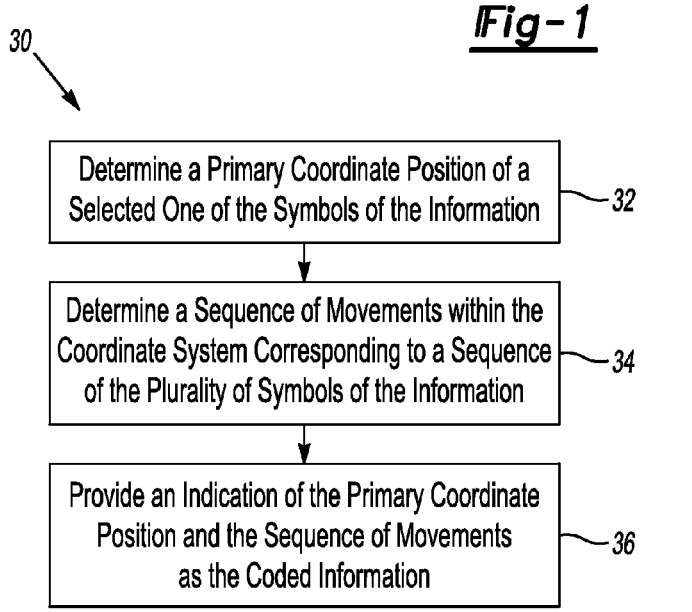
FIG. 3 is a flowchart diagram summarizing an example approach for coding information according to an embodiment of this invention.

FIG. 3 summarizes an example approach for coding information using coordinate positions from within the coordinate system 29. The flowchart diagram 30 begins with a step at 32 wherein the processor 26 determines a primary coordinate position of a selected one of the symbols of the information for which data compression is desired. In one example, the first letter or first symbol of the information is selected to have the primary coordinate position. The processor determines the primary coordinate position in an example using the coordinate system of FIG. 2 by determining the row number and column number of the first symbol of a frame of data.

At 34 the processor 26 determines a sequence of movements within the coordinate system corresponding to a sequence of the plurality of symbols of the information. The sequence of movements corresponds to movement from one coordinate position of a symbol to the coordinate position of the next symbol in the sequence of symbols within the information undergoing data compression. At 36, the processor provides an indication of the primary coordinate position and the sequence of movements as the coded information. In other words, the result of the data compression is an indication of the primary coordinate position and the sequence of movements within the coordinate system corresponding to the sequence of symbols of the information being coded.

As an example, consider the word "INVENTION" as information to undergo data compression. The coding process begins with selecting I as the character to have the primary coordinate position. The primary coordinate position in this example is column 3, row 4. For discussion purposes, movement among the columns (e.g., horizontal movement in FIG. 2) is considered movement in an x direction while movement among the rows (e.g., vertical movement in FIG. 2) is considered movement in a y direction. The coding process includes determining the sequence of movements among the coordinate positions of the sequence of letters in the word INVENTION. For example, movement from the primary coordinate position of the letter I to the coordinate position of the letter N involves a movement of one unit in the x direction because, in the example of FIG. 2, the letter N is in the same row as the letter I but one column over (to the right in FIG. 2). Movement from the coordinate position of N to the coordinate position of V involves movement of one unit in the x direction (to the left according to FIG. 2) and one unit in the y direction (downward according to FIG. 2).

Table 1 below summarizes the relative movements within the coordinate system 20. Each move from one letter to the next (i.e., movement along the sequence of letters in the word INVENTION) is coded. The first column in Table 1 is the count of the symbol or character to be coded. An end of coding (EoC) symbol is added to the end of the word to indicate an end of the coding process. The second column in Table 1 contains the text or sequence of symbols to be coded. The third column includes the decimal ASCII code corresponding to a Microsoft Excel instruction :=CODE (column 2). The fourth column indicates the hexadecimal ASCII code given by the Microsoft Excel instruction :DEC2HEX (column 3). The fifth column designated x(dec) indicates the column on the coding grid or in the coordinate system of FIG. 2. The sixth column designed y(dec) indicates the row or y position in the coordinate system of FIG. 2. The next column designated Move x contains values obtained by using a Microsoft Excel formula :=SI ((x(n)−x(n−1)=0); 0; dec 2 hex (MOD(x(n)−x(n−1)+16; 16))). The information contained in the column designed Move y is obtained using the Microsoft Excel formula :=SI ((y (n)−y(n−1)=0); 10; dec 2 hex (16+ MOD (y(n)−y(n−1)+16; 16))). The last column in Table 1 indicates the character that must be reached by the previous calculation of displacement.

TABLE 1

| Char nb | Text | Text (dec) | ASCII | x (dec) | y (dec) | Move x | Move y | Next char |
|---|---|---|---|---|---|---|---|---|
| 1 | I | 73 | 49 | 03 | 04 | 1 | 10 | N |
| 2 | N | 78 | 4E | 04 | 04 | F | 11 | V |
| 3 | V | 86 | 56 | 03 | 05 | E | 1F | E |
| 4 | E | 69 | 45 | 01 | 04 | 3 | 10 | N |
| 5 | N | 78 | 4E | 04 | 04 | 4 | 10 | T |
| 6 | T | 84 | 54 | 08 | 04 | B | 10 | I |
| 7 | I | 73 | 49 | 03 | 04 | 2 | 10 | O |
| 8 | O | 79 | 4F | 05 | 04 | F | 10 | N |
| 9 | N | 78 | 4E | 04 | 04 | C | 1E | EoC |
| 10 | EoC | | | 00 | 02 | 00 | 1E | |
| | Cc1-Cc2 | 2BA | | | | | | |

In Table 1 a displacement within the coordinate system from one letter to the next that does not involve any change in x position or y position (i.e., does not involve any change in column or row position in the coordinate system of FIG. 2) can be deleted from the coded information. In Table 1, an entry in the "Move y" column designated as 10 indicates that there is no change in y position when moving from the coordinate position of one symbol to the next symbol in the sequence of information to be coded. In this example, each 10 entry in that column is dropped from the coded information. This approach reduces the amount of information required in the coded version of the information undergoing data compression.

Similarly, entries in the "Move x" column that have a 00 value indicate that there is no movement in the x direction in the coordinate system (e.g., no change in the column position in the chart of FIG. 2). 00 entries in the "Move x" column need not be included in the coded information, which allows for reducing the amount of data within the coded, compressed data.

One feature of arranging the symbols within the coordinate system in a manner that is intended to minimize the amount of movement between sequential symbols is that it has the potential for reducing the amount of data within the coded, compressed data. The disclosed example includes symbols such as letters strategically placed within a coding table coordinate system in a manner that minimizes displacements from the coordinate position of one character to the coordinate position of another character. Displacements along one axis simplifies coding. In the example of FIG. 2, when there is no change in the row or column position when moving from the coordinate position of one character to the next, that reduces the amount of data that is included within the coded, compressed information. When there is no change in position along a particular axis between sequential symbols, that information may be deduced during a decoding process.

From Table 1, the following statement in hexadecimal format expresses the primary coordinate position and a sequence of movements within the coordinate system: X'49+x'01+x'0F+x'11+x'0E+x'1F+x'03+x'04+x'0B+x'02+x'0F+x'0C+x'1E.

The next step in this example is to translate the binary selection, in hexadecimal format, which results in the following: X'49+[0 000][1+0 11][11+1 0][001+0][1110]+[1 111][1+0 00][11+0 0][100+0][1011]+[0 001][0+0 11][11+0 1][100+1][1110]. That expression is restated in hex as: X'49+x'0B+x'E2+x'8F+x'8C+x'8B+x'13+x'D9+x'E0.

The previous translation in one embodiment is accomplished using a calculator application like Microsoft Excel, for instance, with the following rules:

$$(Col+line-1)=32*(Col-x-1)+(Line-y-1)$$

$$Byte0=Integer((Col+line-1)/64)$$

$$Byte1=Integer(Modulo((Col+line-1);64)/4)$$

$$Carry=Modulo((Col+line-1);4)$$

$$Byte234=32*32*Carry+32*(Col-x-2)+(Line-y-2)$$

$$Byte1=Integer(Byte234/256)$$

$$Byte2=Integer((Modulo(Byte234;256))/16)$$

$$Byte3=Modulo((Modulo(Byte234;256));16)$$

Table 2 shows the results in byte format.

TABLE 2

| p0 | p1 | p2 | p3 | P01 | R01 | RP23 | Byte0 | Byte1 | Byte2 | Byte3 | Byte4 |
|---|---|---|---|---|---|---|---|---|---|---|---|
| 1 | F | 11 | E | 11 | 3 | 3630 | 0 | B | E | 2 | E |
| 1F | 3 | 4 | B | 248 | 3 | 3211 | F | 8 | C | 8 | B |
| 2 | F | C | 1E | 19 | 3 | 3486 | 1 | 3 | D | 9 | E |

The resulting coding is shown in Table 3.

TABLE 3

| Text | I | N | V | E | N | T | I | O | N | Cc1 | Cc2 |
|---|---|---|---|---|---|---|---|---|---|---|---|
| ASCII | 49 | 4E | 56 | 45 | 4E | 4E | 49 | 4F | 4E | 2 | BA |
| SLCD | 49 | 0B | E2 | EF | 8C | 8B | 13 | D9 | E0 | 02 | BA |

As another example, consider "Alcatel-Lucent est une grande entreprise," which is a sentence in the French language, as information to be coded using the example compression technique. The following Table 4 summarizes the coding based upon the coordinate system of FIG. 2.

TABLE 4

| Char nb | Text | Text (dec) | ASCII | x (dec) | y (dec) | Move x | Move y | Next char |
|---|---|---|---|---|---|---|---|---|
| 1 | A | 65 | 41 | 02 | 04 | 8 | 12 | l |
| 2 | l | 108 | 6C | A | 06 | 5 | 10 | c |
| 3 | c | 99 | 63 | F | 06 | 3 | 10 | a |
| 4 | a | 97 | 61 | 02 | 06 | 6 | 10 | t |
| 5 | t | 116 | 74 | 08 | 06 | 9 | 10 | e |
| 6 | e | 101 | 65 | 01 | 06 | 9 | 10 | l |
| 7 | l | 108 | 6C | A | 06 | 3 | 1C | — |
| 8 | — | 45 | 2D | D | 02 | D | 12 | L |
| 9 | L | 76 | 4C | A | 04 | F | 12 | u |
| 10 | u | 117 | 75 | 09 | 06 | 6 | 10 | c |
| 11 | c | 99 | 63 | F | 06 | 2 | 10 | e |
| 12 | e | 101 | 65 | 01 | 06 | 3 | 10 | n |
| 13 | n | 110 | 6E | 04 | 06 | 4 | 10 | t |
| 14 | t | 116 | 74 | 08 | 06 | 8 | 1E | |
| 15 | | 32 | 20 | 00 | 04 | 1 | 12 | e |
| 16 | e | 101 | 65 | 01 | 06 | 6 | 10 | s |

TABLE 4-continued

| Char nb | Text | Text (dec) | ASCII | x (dec) | y (dec) | Move x | Move y | Next char |
|---|---|---|---|---|---|---|---|---|
| 17 | s | 115 | 73 | 07 | 06 | 1 | 10 | t |
| 18 | t | 116 | 74 | 08 | 06 | 8 | 1E |  |
| 19 |   | 32 | 20 | 00 | 04 | 9 | 12 | u |
| 20 | u | 117 | 75 | 09 | 06 | B | 10 | n |
| 21 | n | 110 | 6E | 04 | 06 | D | 10 | e |
| 22 | e | 101 | 65 | 01 | 06 | F | 1E |  |
| 23 |   | 32 | 20 | 00 | 04 | D | 12 | g |
| 24 | g | 103 | 67 | D | 06 | 9 | 10 | r |
| 25 | r | 114 | 72 | 06 | 06 | C | 10 | a |
| 26 | a | 97 | 61 | 02 | 06 | 2 | 10 | n |
| 27 | n | 110 | 6E | 04 | 06 | 7 | 10 | d |
| 28 | d | 100 | 64 | B | 06 | 6 | 10 | e |
| 29 | e | 101 | 65 | 01 | 06 | F | 1E |  |
| 30 |   | 32 | 20 | 00 | 04 | 1 | 12 | e |
| 31 | e | 101 | 65 | 01 | 06 | 3 | 10 | n |
| 32 | n | 110 | 6E | 04 | 06 | 4 | 10 | t |
| 33 | t | 116 | 74 | 08 | 06 | E | 10 | r |
| 34 | r | 114 | 72 | 06 | 06 | B | 10 | e |
| 35 | e | 101 | 65 | 01 | 06 | F | 11 | p |
| 36 | p | 112 | 70 | 00 | 07 | 6 | 1F | r |
| 37 | r | 114 | 72 | 06 | 06 | D | 10 | i |
| 38 | i | 105 | 69 | 03 | 06 | 4 | 10 | s |
| 39 | s | 115 | 73 | 07 | 06 | A | 10 | e |
| 40 | e | 101 | 65 | 01 | 06 | D | 10 | . |
| 41 | . | 46 | 2E | E | 02 | 2 | 10 | EoC |
| 42 | EoC Cc1-Cc2 | 69 F42 | 45 | 00 | 02 | 00 | 1E |  |

Using the translation techniques described above and removing all indications of movement that do not include any change in x or y direction (e.g., "10" entries in the Move y column) results in the byte format shown in Table 5.

TABLE 5

| p0 | p1 | p2 | p3 | P01 | R01 | RP23 | Byte0 | Byte1 | Byte2 | Byte3 | Byte4 |
|---|---|---|---|---|---|---|---|---|---|---|---|
| 8 | 12 | 5 | 3 | 68 | 2 | 2211 | 4 | 4 | 8 | A | 3 |
| 6 | 9 | 9 | 3 | 50 | 1 | 1315 | 3 | 2 | 5 | 2 | 3 |
| 10 | D | 12 | F | 227 | 1 | 1615 | E | 3 | 6 | 4 | F |
| 12 | 6 | 2 | 3 | 145 | 2 | 2115 | 9 | 1 | 8 | 4 | 3 |
| 4 | 8 | 1E | 1 | 34 | 0 | 961 | 2 | 2 | 3 | C | 1 |
| 12 | 6 | 1 | 8 | 145 | 2 | 2088 | 9 | 1 | 8 | 2 | 8 |
| 1E | 9 | 12 | B | 242 | 1 | 1611 | F | 2 | 6 | 4 | B |
| D | F | 1E | D | 107 | 3 | 4045 | 6 | B | F | C | D |
| 12 | 9 | C | 2 | 146 | 1 | 1410 | 9 | 2 | 5 | 8 | 2 |
| 7 | 6 | F | 1E | 57 | 2 | 2558 | 3 | 9 | 9 | F | E |
| 1 | 12 | 3 | 4 | 12 | 2 | 2148 | 0 | C | 8 | 6 | 4 |
| E | B | F | 11 | 114 | 3 | 3569 | 7 | 2 | D | F | 1 |
| 6 | 1F | D | 4 | 55 | 3 | 3492 | 3 | 7 | D | A | 4 |
| A | D | 10 | 2 | 83 | 1 | 1922 | 5 | 3 | 7 | 8 | 2 |

The resulting coding is shown in Table 6 below. The coded information is divided into frames containing 10 bits per frame in Table 6.

TABLE 6

| Text | A | l | c | a | t | e | l | — | L | u |
|---|---|---|---|---|---|---|---|---|---|---|
| ASCII | 41 | 6C | 63 | 61 | 74 | 65 | 6C | 2D | 4C | 75 |
| SLCD | 41 | 44 | 8A | 33 | 25 | 23 | E3 | 64 | F9 | 18 |

| Text | c | e | n | t | e | s | t | u |
|---|---|---|---|---|---|---|---|---|
| ASCII | 63 | 65 | 6E | 74 | 20 | 65 | 73 | 74 | 20 | 75 |
| SLCD | 43 | 22 | 3C | 19 | 18 | 28 | F2 | 64 | B6 | BF |

TABLE 6-continued

| Text | n | e |   | g | r | a | n | d | e |
|---|---|---|---|---|---|---|---|---|---|
| ASCII | 6E | 65 | 20 | 67 | 72 | 61 | 6E | 64 | 65 | 20 |
| SLCD | CD | 92 | 58 | 23 | 99 | FE | 0C | 86 | 47 | 2D |

| Text | e | n | t | r | e | p | r | i | s | e |
|---|---|---|---|---|---|---|---|---|---|---|
| ASCII | 65 | 6E | 74 | 72 | 65 | 70 | 72 | 69 | 73 | 65 |
| SLCD | F1 | 37 | DA | 45 | 37 | 82 | 0F | 42 |   |   |

| Text | . | Cc1 | Cc2 |
|---|---|---|---|
| ASCII | 2E | F | 42 |
| SLCD |   |   |   |

From this example, the compression ratio corresponds to about a 12% reduction in the amount of data compared to the information prior to coding and compression.

Depending on the particular information to be coded, the compression ratio or the reduction in file size will vary. Additionally, strategically placing the symbols within the coordinate system may yield higher or lower amounts of compression.

Figure 4:
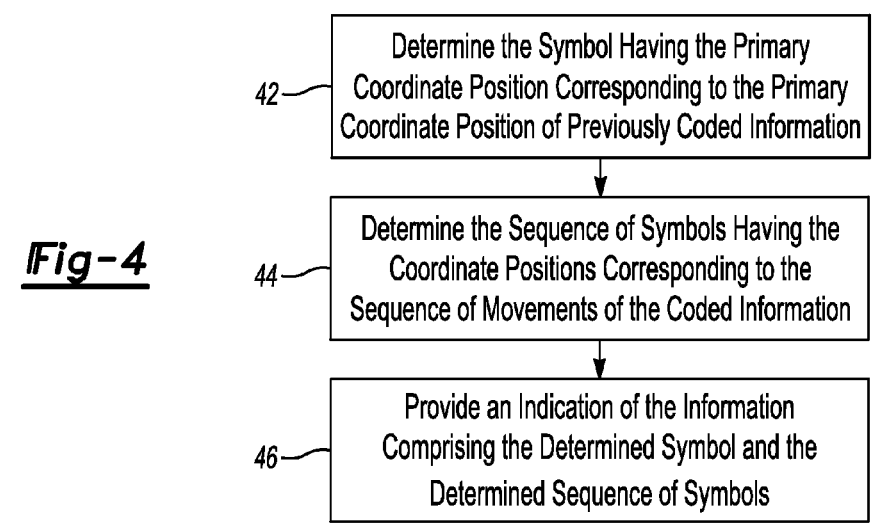
FIG. 4 is a flowchart diagram summarizing an example approach for decoding information according to an example embodiment of this invention.

FIG. 4 summarizes an approach for decoding information that has been coded according to the example described above. The flowchart 40 begins at 42 where one of the processors 26 determines the symbol having the coordinate position corresponding to the primary coordinate position of the coded information. At 44, the sequence of symbols having coordinate positions corresponding to the sequence of movements of the coded information is determined. The step at 46 includes providing an indication of the information comprising the determined symbol and the determined sequence of symbols. In other words, the approach in FIG. 4 takes the coded information and works backward using the coordinate positions of the coded information for decoding the information to arrive at the original sequence of symbols. The decoding process is useful in an example like FIG. 1 by a device 22 that receives a coded communication from the other device 22.

In the examples provided above, the sequence of movements corresponds to a movement from the coordinate position of each symbol to the next symbol in the sequence of symbols in the information being coded. In other examples, the sequence of movements includes multiple movements taken from the position of the primary coordinate position. In other words, other examples include expressing the sequence of movements as a sequence of movements from the primary coordinate position to the coordinate position of each symbol in the sequence, respectively.

The preceding description is exemplary rather than limiting in nature. Variations and modifications to the disclosed examples may become apparent to those skilled in the art that do not necessarily depart from the essence of this invention. The scope of legal protection given to this invention can only be determined by studying the following claims.

I claim:

1. An encoder device, comprising:
a data storage comprising an indication of a coordinate system and a set of symbols, each having at least one coordinate position in the coordinate system; and
a processor associated with the data storage, the processor being configured to encode at least one symbol within information comprising a plurality of symbols using the coordinate position of the at least one symbol relative to the coordinate position of another symbol within the information, wherein the processor is configured to
determine a primary coordinate position of a selected one of the symbols of the information, and
determine a sequence of movements within the coordinate system corresponding to a sequence of the plurality of symbols of the information, wherein at least a beginning of the sequence of movements is determined based on the primary coordinate position.

2. The device of claim 1, wherein the sequence of movements comprises:
a first movement from the primary coordinate position of the selected one of the symbols to the coordinate position of a sequentially adjacent one of the symbols of the information; and
a plurality of next movements to the coordinate position of a next sequentially adjacent one of the symbols from the coordinate position of the previous adjacent one of the symbols.

3. An encoder device, comprising:
a data storage comprising an indication of a coordinate system and a set of symbols, each having at least one coordinate position in the coordinate system; and
a processor associated with the data storage, the processor being configured to encode at least one symbol within information comprising a plurality of symbols using the coordinate position of the at least one symbol relative to the coordinate position of another symbol within the information wherein the set of symbols are arranged in the coordinate system to reduce an amount of movement within the coordinate system between adjacent symbols of the information.

4. The device of claim 3, wherein
the coordinate system comprises a grid having at least two dimensions; and
a movement from one coordinate position of one of the symbols to another coordinate position of another of the symbols includes moving along at least one of the dimensions.

5. The device of claim 4, wherein the processor is configured to
determine the row and column location of each symbol in the information;
determine whether a movement between the coordinate position of one of the symbols of the information and the coordinate position of an adjacent one of the symbols of the information includes movement between two different rows or two different columns;
provide a first amount of coded information for a movement that includes movement between two of the rows and between two of the columns; and
provide a second amount of coded information, which is less than the first amount, for a movement between two symbol coordinate positions within a single row or for a movement between two symbol coordinate positions within a single column.

6. A decoder device, comprising:
a data storage comprising an indication of a coordinate system and a set of symbols, each having a coordinate position in the coordinate system; and
a processor associated with the data storage, the processor being configured to decode at least one symbol within coded information by determining a coordinate position of the at least one symbol relative to another coordinate position within the information wherein
the coded information comprises a sequence of movements between the coordinate positions of the symbols of the information; and
the processor is configured to
decode the information by
determining the symbol having the coordinate position corresponding to a primary coordinate position of the coded information, and
determining the sequence of symbols having the coordinate positions corresponding to the sequence of movements of the coded information.

7. The device of claim 6, wherein the sequence of movements comprises:
a first movement from the primary coordinate position of the selected one of the symbols to the coordinate position of a sequentially adjacent one of the symbols of the information; and
a plurality of next movements to the coordinate position of a next sequentially adjacent one of the symbols from the coordinate position of the previous adjacent one of the symbols.

8. The device of claim 6, wherein the set of symbols are arranged in the coordinate system to reduce an amount of movement within the coordinate system between adjacent symbols of the information.

9. The device of claim 6, wherein
the coordinate system comprises a grid having at least two dimensions; and
a movement from one coordinate position of one of the symbols to another coordinate position of another of the symbols includes moving along at least one of the dimensions.

10. A method of coding information comprising a plurality of symbols, the method comprising:
determining at least one coordinate position within a coordinate system of at least one of the symbols using the coordinate position of the at least one symbol relative to the coordinate position of another symbol within the information,
determining a primary coordinate position of a selected one of the symbols of the information, and
determining a sequence of movements within the coordinate system corresponding to a sequence of the plurality of symbols, wherein at least a beginning of the sequence of movements is determined based on the primary coordinate position.

11. The method of claim 10, wherein the set of symbols are arranged in the coordinate system to reduce an amount of movement within the coordinate system between adjacent symbols of the information.

12. The method of claim 10, wherein the sequence of movements comprises:
a first movement from the primary coordinate position of the selected one of the symbols to the coordinate position of a sequentially adjacent one of the symbols of the information; and
a plurality of next movements to the coordinate position of a next sequentially adjacent one of the symbols from the coordinate position of the previous adjacent one of the symbols.

13. The method of claim 10, wherein
the coordinate system comprises a grid having at least two dimensions, and
a movement from one coordinate position of one of the symbols to another coordinate position of another of the symbols includes moving along at least one of the dimensions.

14. The method of claim 13, comprising
determining the row and column location of each symbol in the information;
determining whether a movement between the coordinate position of one of the symbols of the information and the coordinate position of an adjacent one of the symbols of the information includes movement between two different rows or two different columns;
providing a first amount of coded information for a movement that includes movement between two of the rows and between two of the columns; and
providing a second amount of coded information, which is less than the first amount, for a movement between two symbol coordinate positions within a single row or for a movement between two symbol coordinate positions within a single column.

15. A method of decoding coded information, comprising:
determining at least one symbol within coded information by determining a coordinate position of the at least one symbol relative to another coordinate position within the information wherein the coded information comprises a primary coordinate position of at least one of the symbols and a sequence of movements between the coordinate positions of the symbols of the information; and
the method comprises decoding the information by
determining the symbol having the coordinate position corresponding to a primary coordinate position of the coded information, and
determining the sequence of symbols having the coordinate positions corresponding to the sequence of movements of the coded information.

16. The method of claim 15, wherein the sequence of movements comprises:
a first movement from the primary coordinate position of the selected one of the symbols to the coordinate position of a sequentially adjacent one of the symbols of the information; and
a plurality of next movements to the coordinate position of a next sequentially adjacent one of the symbols from the coordinate position of the previous adjacent one of the symbols.

17. The method of claim 15, wherein the set of symbols are arranged in the coordinate system to reduce an amount of movement within the coordinate system between adjacent symbols of the information.

\* \* \* \* \*